US010522660B2

(12) United States Patent
Lin et al.

(10) Patent No.: US 10,522,660 B2
(45) Date of Patent: Dec. 31, 2019

(54) METHOD FOR FABRICATING SEMICONDUCTOR DEVICE

(71) Applicant: UNITED MICROELECTRONICS CORP., Hsin-Chu (TW)

(72) Inventors: Chun-Hao Lin, Kaohsiung (TW); Hsin-Yu Chen, Nantou County (TW); Shou-Wei Hsieh, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/690,260

(22) Filed: Aug. 29, 2017

(65) Prior Publication Data

US 2019/0043964 A1 Feb. 7, 2019

(30) Foreign Application Priority Data

Aug. 3, 2017 (TW) .............................. 106126242 A (51) Int. Cl.
*H01L 29/66* (2006.01)
*H01L 21/762* (2006.01)
*H01L 21/3105* (2006.01)
*H01L 29/06* (2006.01)
*H01L 21/02* (2006.01)

(52) U.S. Cl.
CPC .. *H01L 29/66795* (2013.01); *H01L 21/31053* (2013.01); *H01L 21/76224* (2013.01); *H01L 29/0649* (2013.01); *H01L 29/66545* (2013.01); *H01L 21/0217* (2013.01); *H01L 21/02164* (2013.01); *H01L 21/02271* (2013.01)

(58) Field of Classification Search
None
See application file for complete search history.

(56) References Cited

U.S. PATENT DOCUMENTS

| 8,502,316 B2 | 8/2013 | Fung et al. |
| 9,412,616 B1* | 8/2016 | Xie .................... H01L 21/76224 |
| 2001/0017417 A1* | 8/2001 | Kuroda ............. H01L 21/28525 |
| | | 257/758 |
| 2014/0027820 A1 | 1/2014 | Aquilino et al. |
| 2015/0108577 A1* | 4/2015 | Cai .................... H01L 21/28008 |
| | | 257/369 |

OTHER PUBLICATIONS

Lin, Title of Invention: Semiconductor Device and Method for Fabricating the Same, U.S. Appl. No. 15/660,991, filed Jul. 27, 2017.

* cited by examiner

*Primary Examiner* — Anthony Ho
*Assistant Examiner* — Kevin Quinto
(74) *Attorney, Agent, or Firm* — Winston Hsu (57) ABSTRACT

A method for fabricating semiconductor device includes the steps of: forming a fin-shaped structure on a substrate; forming a first gate structure and a second gate structure on the fin-shaped structure; forming an interlayer dielectric (ILD) layer around the first gate structure and the second gate structure; removing the second gate structure and part of the fin-shaped structure to form a first trench; forming a dielectric layer into the first trench; and planarizing part of the dielectric layer to form a single diffusion break (SDB) structure. Preferably, the top surfaces of the SDB structure and the first gate structure are coplanar.

9 Claims, 10 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly to a method for dividing fin-shaped structure to form single diffusion break (SDB) structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication, after shallow trench isolation (STI) is formed around the fin-shaped structure part of the fin-shaped structure and part of the STI could be removed to form a trench, and insulating material is deposited into the trench to form single diffusion break (SDB) structure or isolation structure. However, the integration of the SDB structure and metal gate fabrication still remains numerous problems. Hence how to improve the current FinFET fabrication and structure has become an important task in this field.

SUMMARY OF THE INVENTION

According to an embodiment of the present invention, a method for fabricating semiconductor device includes the steps of: forming a fin-shaped structure on a substrate; forming a first gate structure and a second gate structure on the fin-shaped structure; forming an interlayer dielectric (ILD) layer around the first gate structure and the second gate structure; removing the second gate structure and part of the fin-shaped structure to form a first trench; forming a dielectric layer into the first trench; and planarizing part of the dielectric layer to form a single diffusion break (SDB) structure. Preferably, the top surfaces of the SDB structure and the first gate structure are coplanar.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
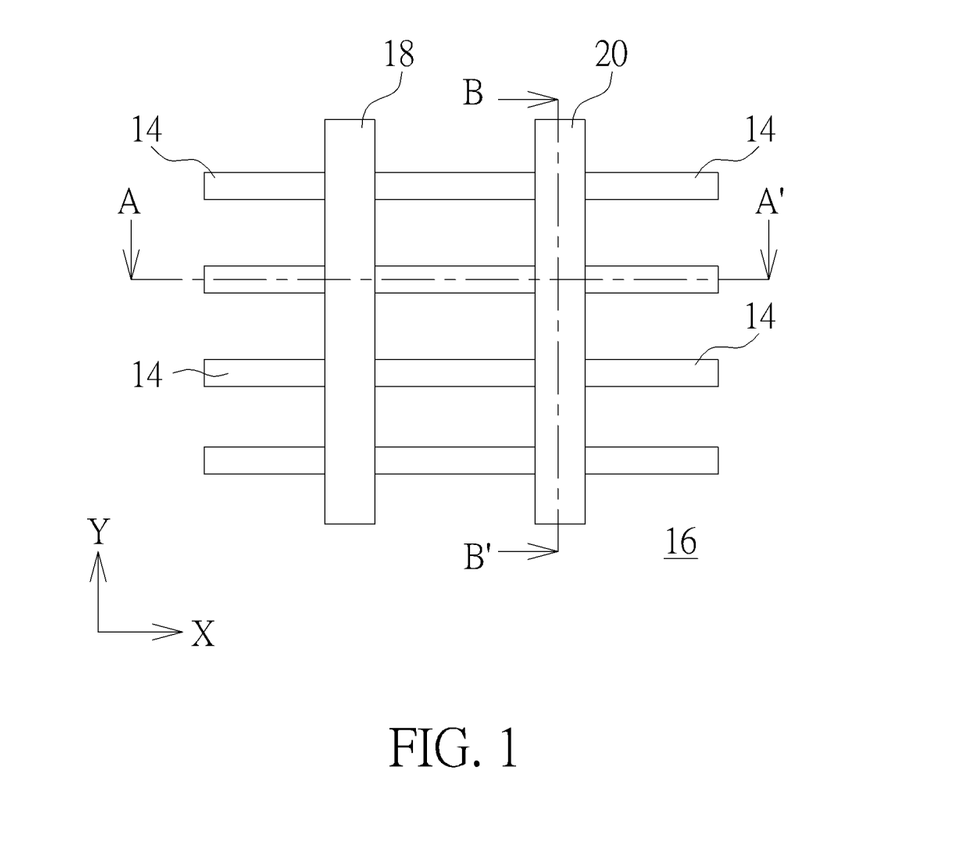
FIGS. 1-8 illustrate a method for fabricating a semiconductor device according to an embodiment of the present invention.
Figure 2:
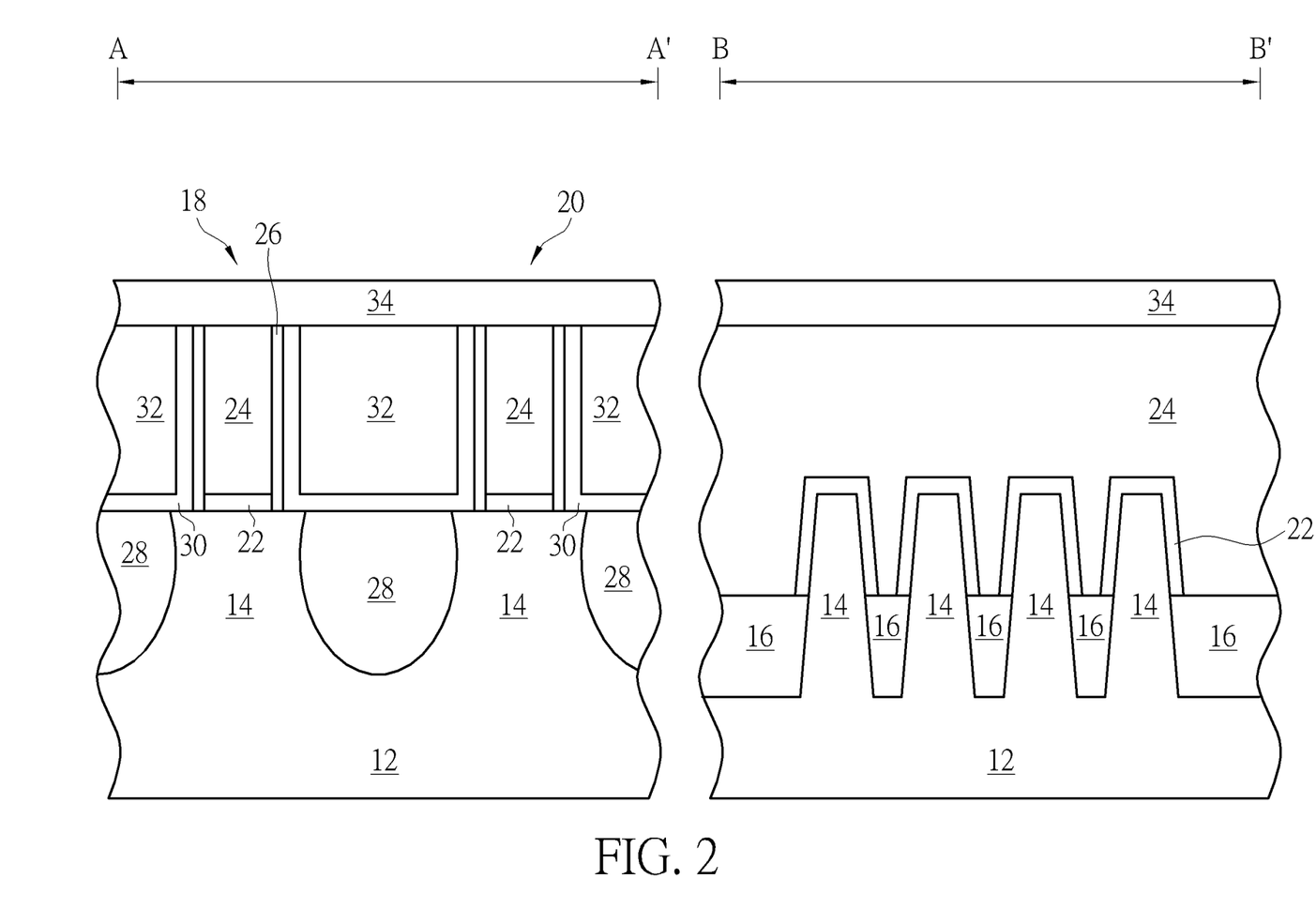

Referring to FIGS. 1-2, in which FIG. 1 is a top view illustrating a method for fabricating a semiconductor device according to an embodiment of the present invention, the left portion of FIG. 2 illustrates a cross-sectional view of FIG. 1 for fabricating the semiconductor device along the sectional line AA', and the right portion of FIG. 2 illustrates a cross-sectional view of FIG. 1 for fabricating the semiconductor device along the sectional line BB'. As shown in FIGS. 1-2, a substrate 12, such as a silicon substrate or silicon-on-insulator (SOI) substrate is first provided, and a plurality of fin-shaped structures 14 are formed on the substrate 12. It should be noted that even though four fin-shaped structures 14 are disposed on the substrate 12 in this embodiment, it would also be desirable to adjust the number of fin-shaped structures 14 depending on the demand of the product, which is also within the scope of the present invention.

Preferably, the fin-shaped structures 14 of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 14 could also be obtained by first forming a patterned mask (not shown) on the substrate, 12, and through an etching process, the pattern of the patterned mask is transferred to the substrate 12 to form the fin-shaped structures 14. Moreover, the formation of the fin-shaped structures 14 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 14. These approaches for forming fin-shaped structure are all within the scope of the present invention.

Next, a shallow trench isolation (STI) 16 is formed around the fin-shaped structures 14. In this embodiment, the formation of the STI 16 could be accomplished by conducting a flowable chemical vapor deposition (FCVD) process to form a silicon oxide layer on the substrate 12 and covering the fin-shaped structures 14 entirely. Next, a chemical mechanical polishing (CMP) process along with an etching process are conducted to remove part of the silicon oxide layer so that the top surface of the remaining silicon oxide is slightly lower than the top surface of the fin-shaped structures 14 for forming the STI 16.

Next, at least a gate structures or dummy gate such as a first gate structure 18 and a second gate structure 20 are formed on the fin-shaped structure 14. In this embodiment, the formation of the first gate structure 18 and second gate structure 20 could be accomplished by a gate first process, a high-k first approach from gate last process, or a high-k last approach from gate last process. Since this embodiment pertains to a high-k last approach, a gate dielectric layer or interfacial layer, a gate material layer made of polysilicon, and a selective hard mask could be formed sequentially on the substrate 12, and a photo-etching process is then conducted by using a patterned resist (not shown) as mask to remove part of the gate material layer and part of the gate dielectric layer through single or multiple etching processes. After stripping the patterned resist, a first gate structure 18 and second gate structure 20 each composed of a patterned gate dielectric layer 22 and a patterned material layer 24 are formed on the fin-shaped structure 14.

Next, at least a spacer 26 is formed on the sidewalls of the each of the first gate structure 18 and second gate structure 20, a source/drain region 28 and/or epitaxial layer (not shown) is formed in the fin-shaped structure 14 adjacent to two sides of the spacer 26, and selective silicide layers (not shown) could be formed on the surface of the source/drain regions 28. In this embodiment, the spacer 26 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain regions 28 could include n-type dopants or p-type dopants depending on the type of device being fabricated.

Next, a contact etch stop layer (CESL) 30 is formed on the surface of the fin-shaped structures 14 and covering the first gate structure 18 and the second gate structure 20, and an interlayer dielectric (ILD) layer 32 is formed on the CESL 30. Next, a planarizing process such as CMP is conducted to remove part of the ILD layer 32 and part of the CESL 30 for exposing the gate material layer 24 made of polysilicon, in which the top surface of the gate material layer 24 is even with the top surface of the ILD layer 32. Next, a mask layer 34 is formed on the first gate structure 18, the second gate structure 20, and the ILD layer 32. In this embodiment, the mask layer 34 preferably includes silicon nitride or titanium nitride (TiN), but not limited thereto.

Figure 3:
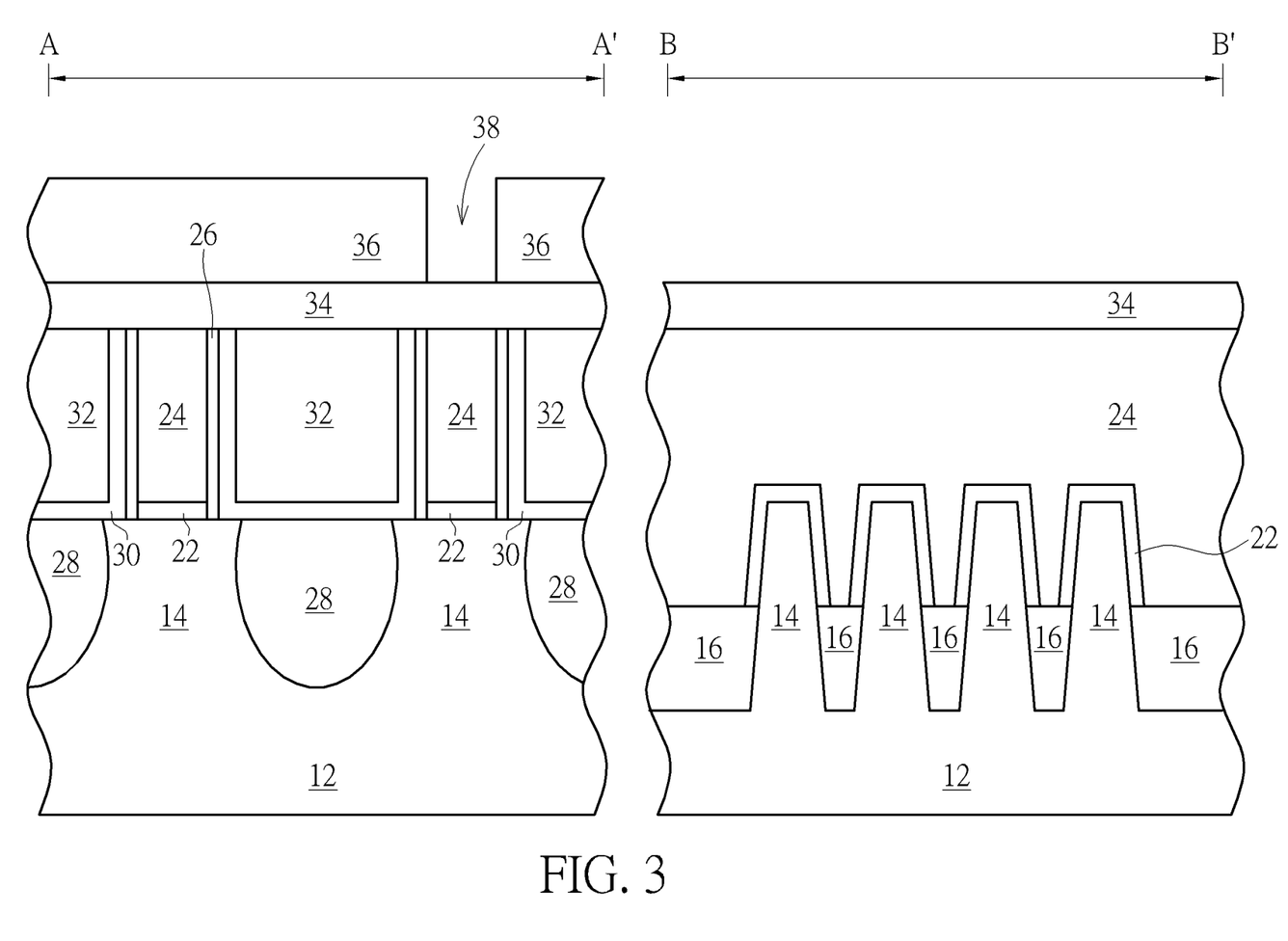

Next, as shown in FIG. 3, a patterned mask 36, such as a patterned resist is formed on the mask layer 34, in which the patterned mask 36 includes an opening 38 exposing the surface of the mask layer 34. In this embodiment, the patterned mask 36 could include a tri-layer structure having an organic dielectric layer (ODL), a silicon-containing hard mask bottom anti-reflective coating (SHB), and a patterned resist and the process of forming the opening 38 in the patterned mask 36 could be accomplished by using the patterned resist as mask to remove part of the SHB and part of the ODL.

Figure 4:
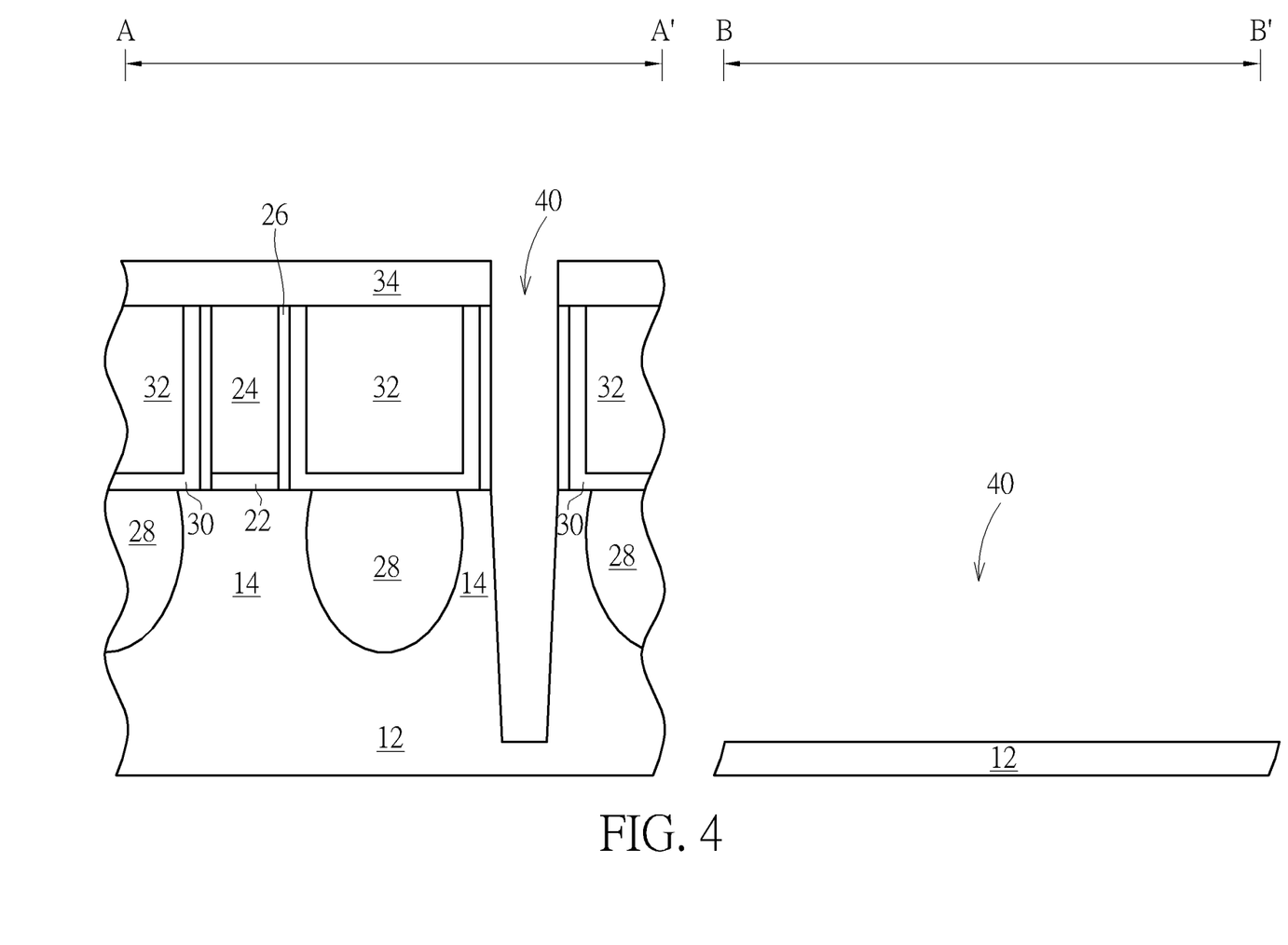

Next, as shown in FIG. 4, an etching process is conducted by using the patterned mask 36 as mask to remove part of the mask layer 34, the second gate structure 20, and part of the fin-shaped structure 14 to form a first trench 40, and the patterned mask 36 is removed completely. Specifically, the formation of the first trench 40 is accomplished by sequentially removing part of the mask layer 34, the gate material layer 24 and gate dielectric layer 22 of the second gate structure 20, and part of the fin-shaped structure 14 to form the first trench 40 in the ILD layer 32 and part of the fin-shaped structure 14. It should be noted that the step of forming the first trench 40 not only removes part of the fin-shaped structure 14 downward but also removes all the STI 16 surrounding the fin-shaped structure 14 at the same time so that the depth of the first trench 40 is preferably lower than the original depth of the STI 16, as shown in the BB' cross-section view of FIG. 4.

It should also be noted that since the first trench 40 is formed by removing the original second gate structure 20, the extending direction of the first trench 40 is also the same as the original extending direction of the second gate structure 20. In other words, in contrast to the fin-shaped structures 14 extending along a first direction (such as X-direction) as shown in FIG. 1, the first trench 40 is formed extending along a second direction (such as Y-direction) orthogonal to the first direction.

Figure 5:
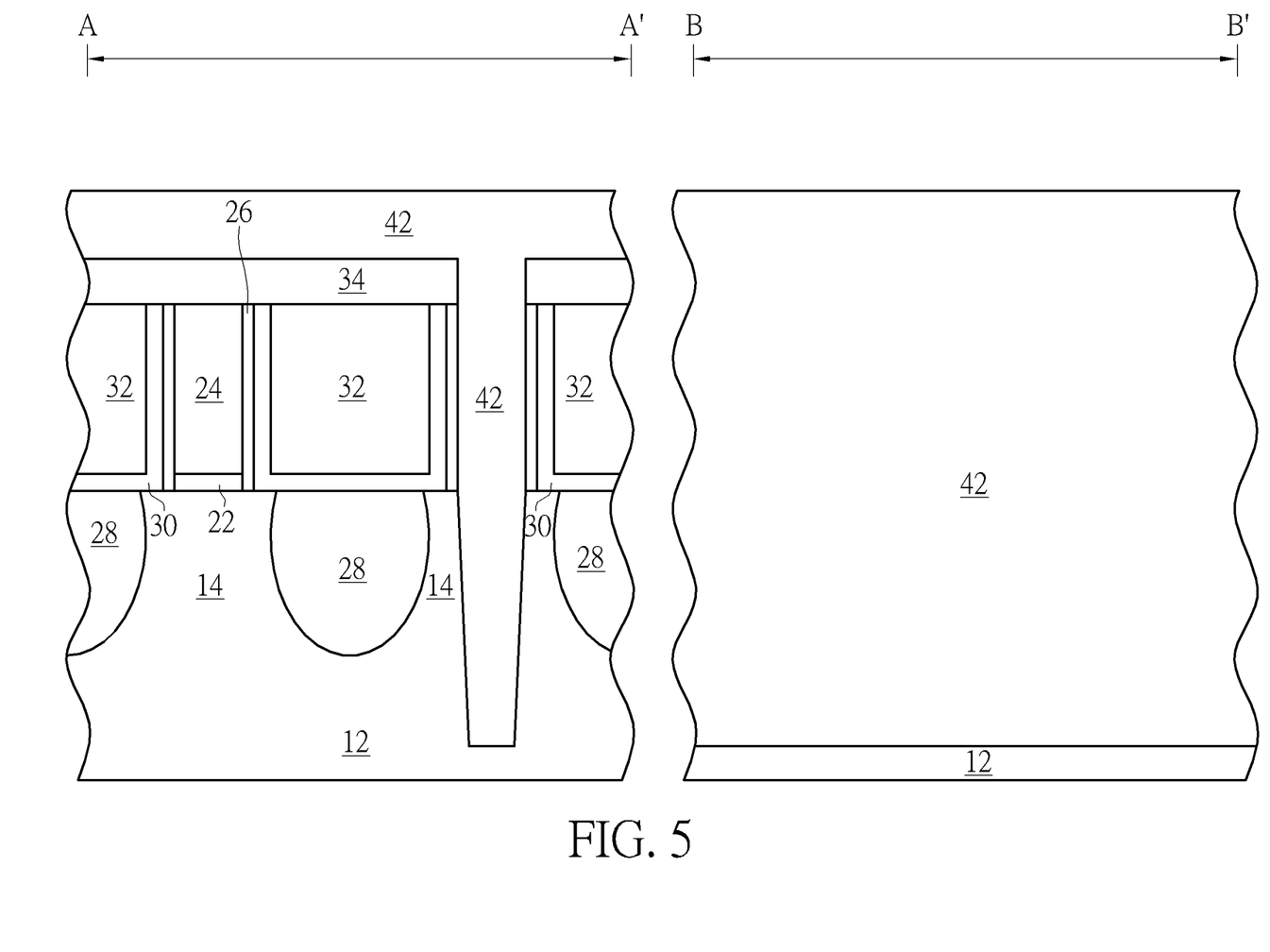

Next, as shown in FIG. 5, a dielectric layer 42 is formed on the mask layer 34 and filling the first trench 40 completely. In this embodiment, the dielectric layer 42 and the ILD layer 32 could be made of same material or different material. For instance, the ILD layer 32 in this embodiment preferably includes silicon oxide while the dielectric layer 42 could include either silicon oxide or silicon nitride, which are all within the scope of the present invention.

Figure 6:
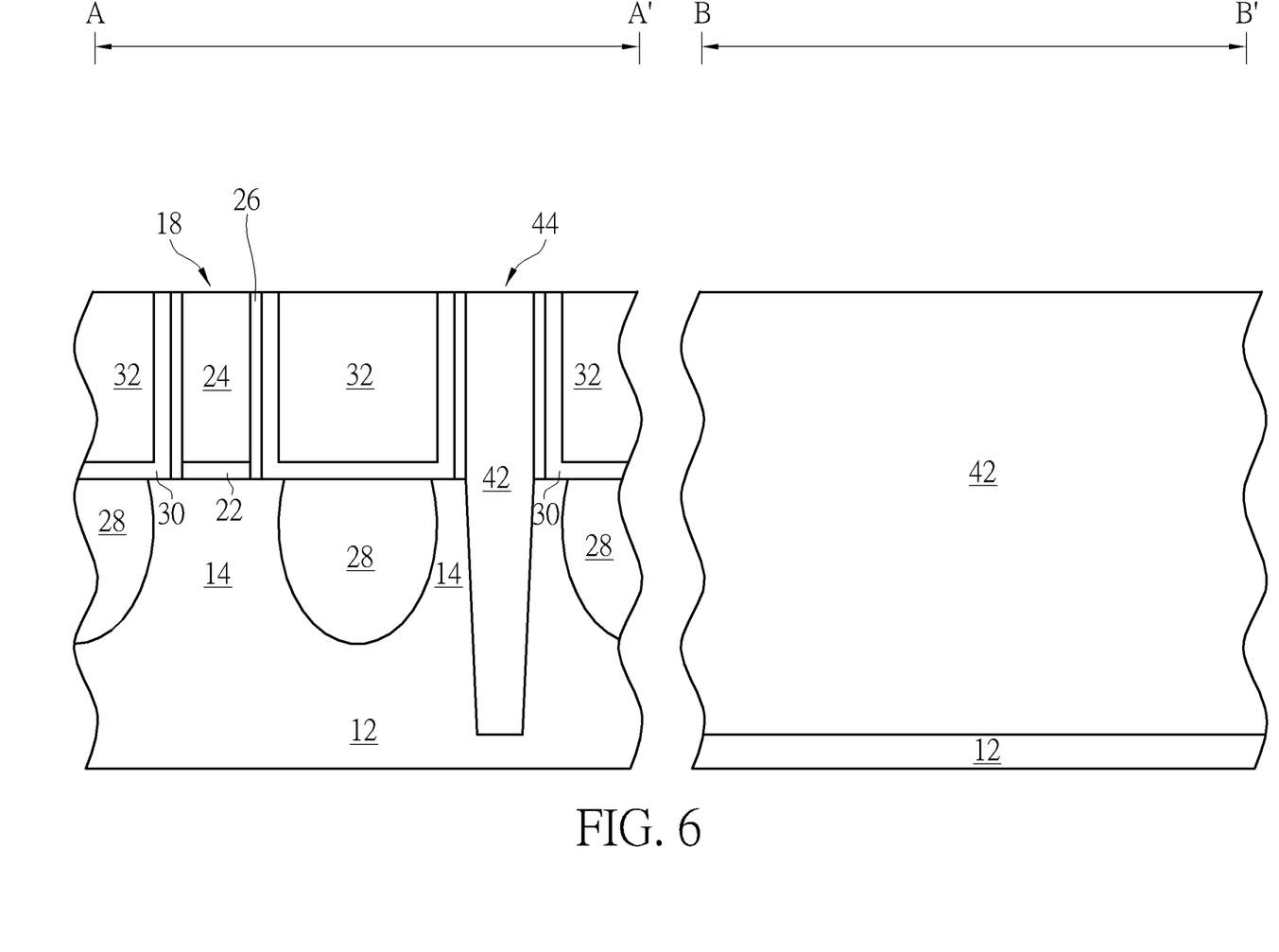

Next, as shown in FIG. 6, a planarizing process such as CMP and/or etching back process is conducted to remove part of the dielectric layer 42 and the mask layer 34 so that the top surface of the remaining dielectric layer 42 is even with the top surface of the ILD layer 32 and first gate structure 18 for forming a single diffusion break (SDB) structure 44. Similar to the extending direction of the first trench 40 and different from the extending direction of the fin-shaped structures 14 shown in FIG. 1, the SDB structure 44 formed at this stage is extending along a second direction (such as Y-direction) orthogonal to the first direction of the fin-shaped structures 14.

Figure 7:
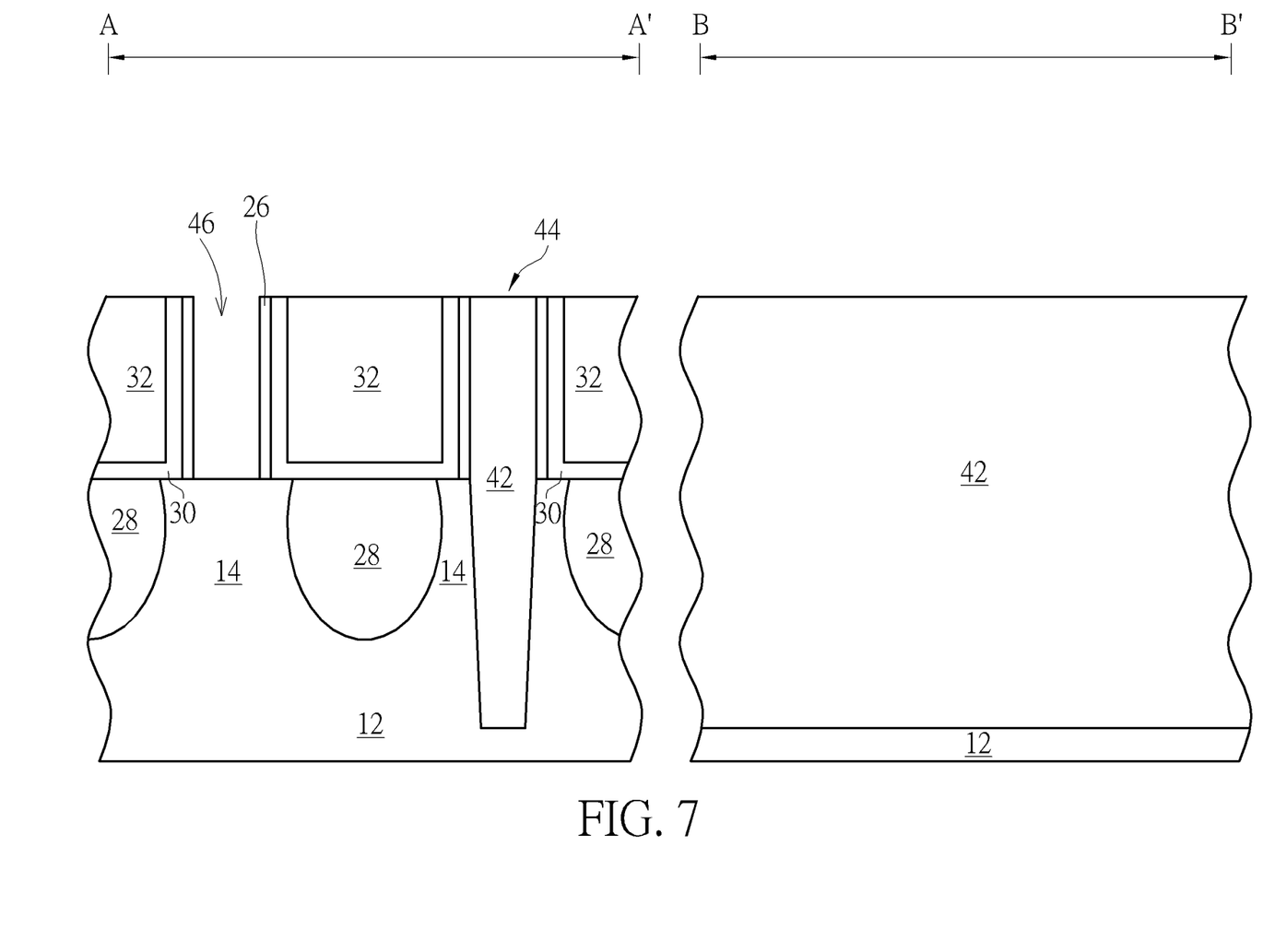

Next, as shown in FIG. 7, a replacement metal gate (RMG) process is conducted to transform the first gate structure 18 into a metal gate. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 20 and even gate dielectric layer 22 of first gate structure 18 for forming a second trench 46 in the ILD layer 32.

Figure 8:
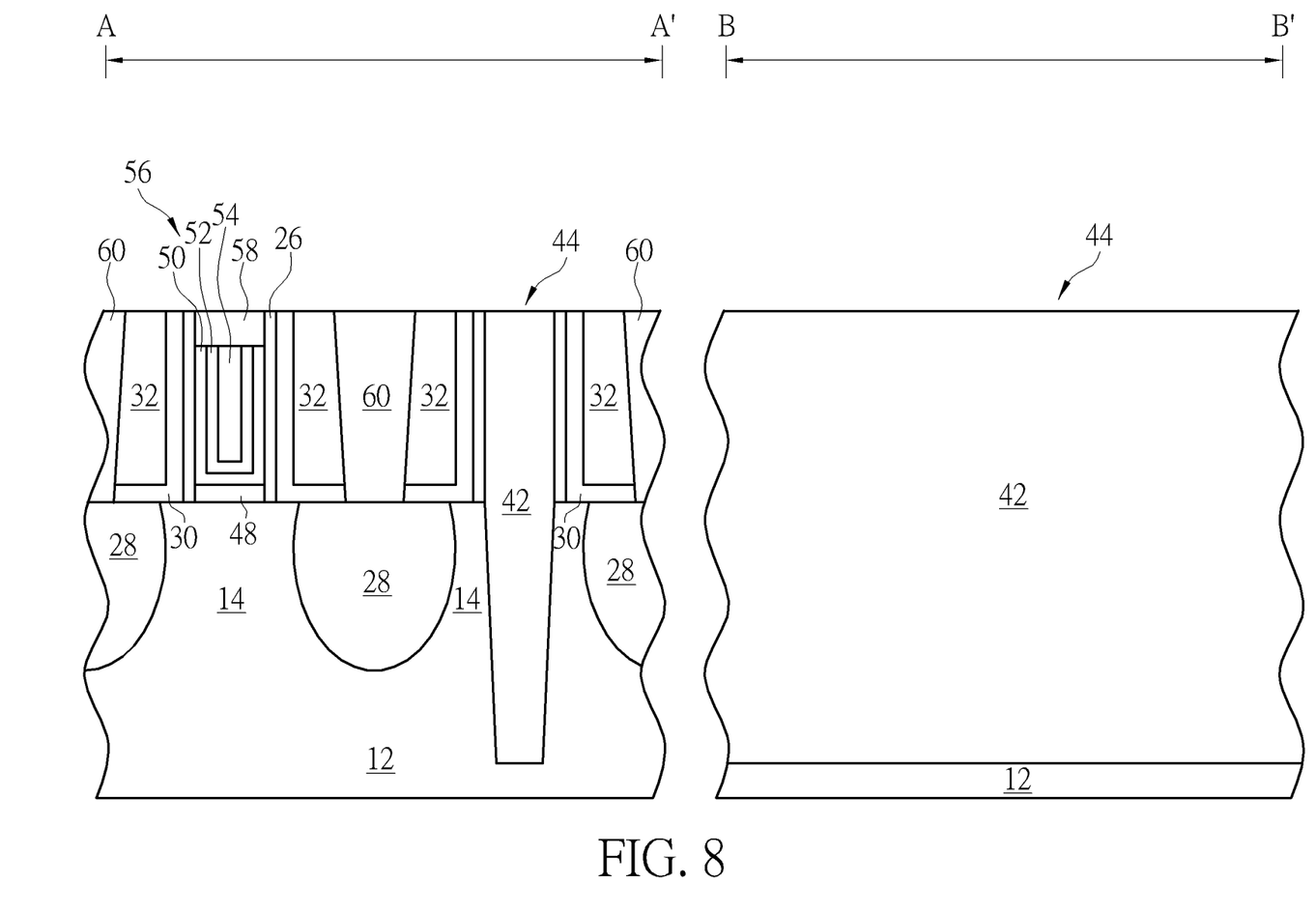

Next, as shown in FIG. 8, a selective interfacial layer 48 or gate dielectric layer (not shown), a high-k dielectric layer 50, a work function metal layer 52, and a low resistance metal layer 54 are formed in the second trench 46, and a planarizing process such as CMP is conducted to remove part of low resistance metal layer 54, part of work function metal layer 52, and part of high-k dielectric layer 50 to form a metal gate 56. Next, part of the low resistance metal layer 54, part of the work function metal layer 52, and part of the high-k dielectric layer 50 are removed to form a recess (not shown), and a hard mask 58 made of dielectric material including but not limited to for example silicon nitride is deposited into the recess so that the top surfaces of the hard mask 58 and ILD layer 32 are coplanar. In this embodiment, the gate structure or metal gate 56 fabricated through high-k last process of a gate last process preferably includes an interfacial layer 48 or gate dielectric layer (not shown), a U-shaped high-k dielectric layer 50, a U-shaped work function metal layer 52, and a low resistance metal layer 54.

In this embodiment, the high-k dielectric layer 50 is preferably selected from dielectric materials having dielectric constant (k value) larger than 4. For instance, the high-k dielectric layer 50 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 52 is formed for tuning the work function of the metal gate in accordance with the conductivity of the device. For an NMOS transistor, the work function metal layer 52 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 52 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 52 and the low resistance metal layer 54, in which the material of the barrier layer may include titanium (Ti), titanium nitride (TiN), tantalum (Ta) or tantalum nitride (TaN). Furthermore, the material of the low-resistance metal layer 54 may include copper (Cu), aluminum (Al), titanium aluminum (TiAl), cobalt tungsten phosphide (CoWP) or any combination thereof.

Next, a pattern transfer process is conducted by using a patterned mask (not shown) as mask to remove part of the ILD layer 32 adjacent to the metal gate 56 and SDB structure 44 for forming contact holes (not shown) exposing the source/drain regions 28 underneath. Next, metals including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as CMP is conducted to remove part of aforementioned barrier layer and low resistance metal layer for forming contact plugs 60 electrically connecting the source/drain regions 28. This completes the fabrication of a semiconductor device according to a preferred embodiment of the present invention.

Figure 9:
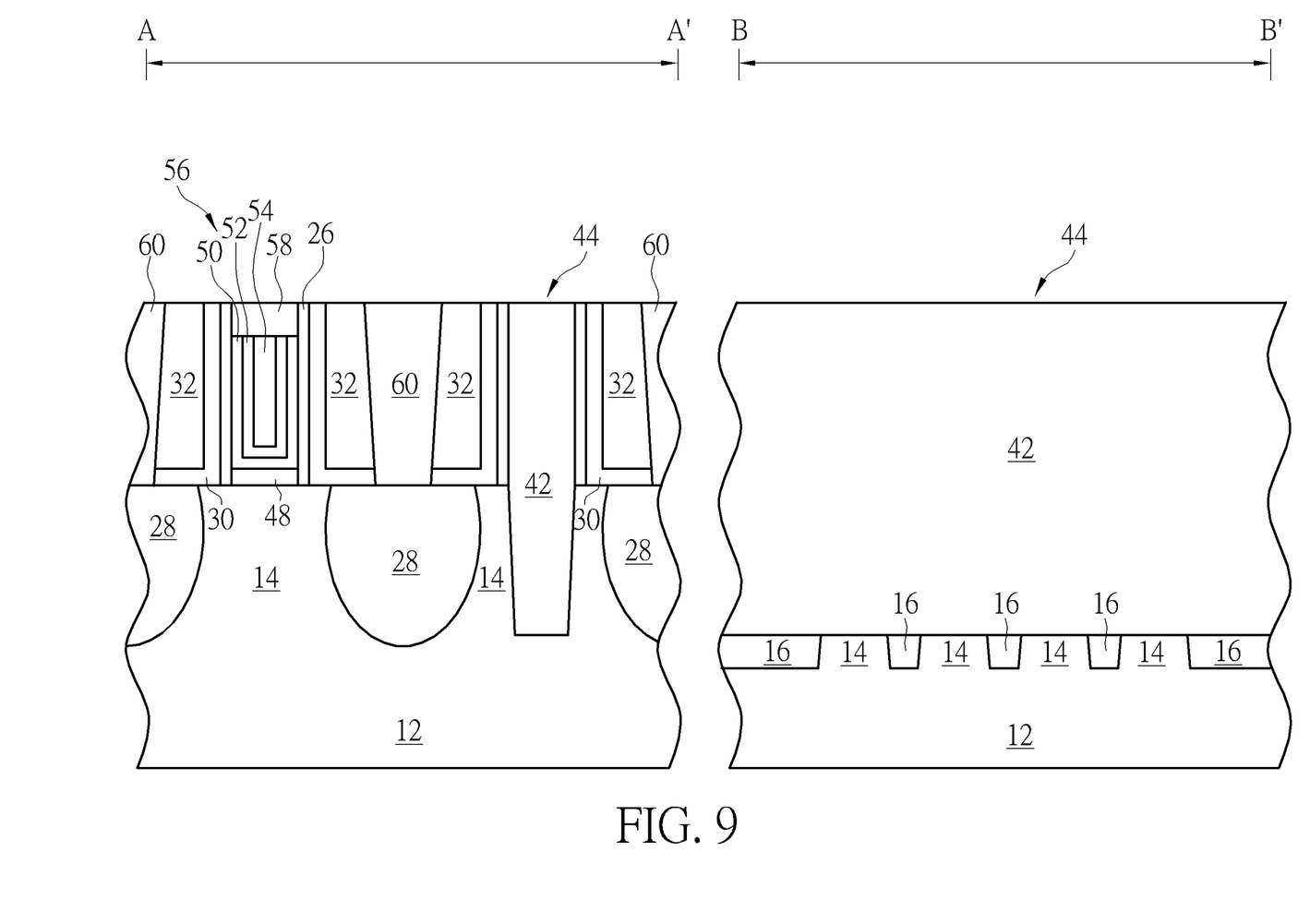
FIG. 9 illustrates a method for fabricating a semiconductor device according to an embodiment of the present invention.

Referring to FIG. 9, FIG. 9 illustrates a method for fabricating a semiconductor device according to an embodiment of the present invention. As shown in FIG. 9, it would be desirable to only remove part of the STI 16 when part of the mask layer 34, the gate material layer 24 and gate dielectric layer 22 from the second gate structure 20, and part of the fin-shaped structure 14 are removed in FIG. 4 to form the first trench 40, and then conducting follow-up processes in FIGS. 5-8 by forming dielectric layer 42 to form SDB structure 44 and conducting a RMG process to transform the first gate structure 18 into metal gate. In this embodiment, the bottom of the SDB structure 44 is slightly higher than the bottom of the STI 16. Nevertheless, the bottom of the SDB structure 44 could also be adjusted to be even with or lower than the bottom of the STI 16, which are all within the scope of the present invention.

Figure 10:
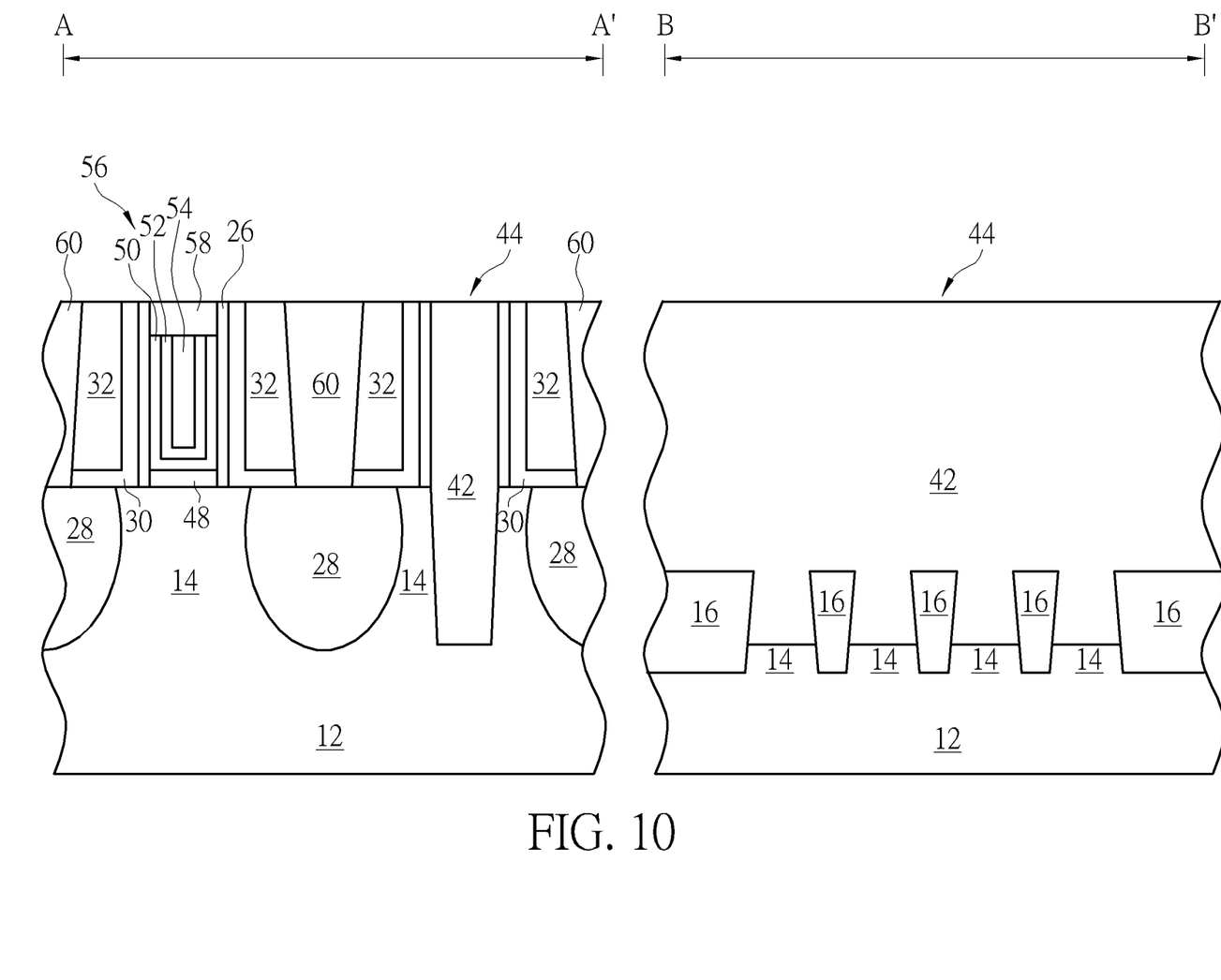
FIG. 10 illustrates a method for fabricating a semiconductor device according to an embodiment of the present invention.

Referring to FIG. 10, FIG. 10 illustrates a method for fabricating a semiconductor device according to an embodiment of the present invention. As shown in FIG. 10, it would be desirable to not remove any of the STI 16 when part of the mask layer 34, the gate material layer 24 and gate dielectric layer 22 from the second gate structure 20, and part of the fin-shaped structure 14 are removed in FIG. 4 to form the first trench 40, and then conducting follow-up processes as disclosed in FIGS. 5-8 by forming dielectric layer 42 to form SDB structure 44 and conducting a RMG process to transform the first gate structure 18 into metal gate. In this embodiment, the bottom of part of the SDB structure 44 disposed between the STI 16 is slightly higher than the bottom of the STI 16 and lower than the top surface of the STI 16. Nevertheless, the bottom of the SDB structure 44 could also be adjusted to be even with or lower than the bottom of the STI 16, which are all within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   forming a fin-shaped structure on a substrate;
   forming a first gate structure and a second gate structure on the fin-shaped structure;
   forming an interlayer dielectric (ILD) layer around the first gate structure and the second gate structure;
   forming a mask layer on the first gate structure, the second gate structure, and the ILD layer, wherein the mask layer and the ILD layer are made of different materials;
   removing part of the mask layer, the second gate structure, and part of the fin-shaped structure to form a first trench;
   forming a dielectric layer into the first trench, wherein the first trench is filled entirely by the dielectric layer only;
   planarizing part of the dielectric layer and all of the mask layer to form a single diffusion break (SDB) structure, wherein the top surfaces of the SDB structure and the first gate structure are coplanar; and
   performing a replacement metal gate (RMG) process to transform the first gate structure into a metal gate while the SDB structure completely fills the first trench.

2. The method of claim 1, wherein the dielectric layer and the ILD layer are made of different materials.

3. The method of claim 1, wherein the dielectric layer comprises silicon nitride.

4. The method of claim 1, wherein the dielectric layer comprises silicon oxide.

5. The method of claim 1, further comprising performing the replacement metal gate (RMG) process to transform the first gate structure into a metal gate after forming the SDB structure.

6. The method of claim 5, further comprising:
   removing the first gate structure to form a second trench;
   forming a work function metal layer and a low resistance metal layer in the second trench to form the metal gate; and
   forming a hard mask on the metal gate, wherein the top surfaces of the hard mask and the SDB structure are coplanar.

7. The method of claim 1, wherein the fin-shaped structure is disposed extending along a first direction and the SDB structure is disposed extending along a second direction.

8. The method of claim 7, wherein the first direction is orthogonal to the second direction.

9. A method for fabricating semiconductor device, comprising:
- forming a fin-shaped structure on a substrate;
- forming a shallow trench isolation (STI) around the fin-shaped structure;
- forming a first gate structure and a second gate structure on the fin-shaped structure;
- forming an interlayer dielectric (ILD) layer around the first gate structure and the second gate structure;
- forming a mask layer on the first gate structure, the second gate structure, and the ILD layer, wherein the mask layer and the ILD layer are made of different materials;
- removing part of the mask layer, the second gate structure, and part of the fin-shaped structure to form a first trench;
- forming a dielectric layer into the first trench;
- planarizing part of the dielectric layer and all of the mask layer to form a single diffusion break (SDB) structure, wherein the top surfaces of the SDB structure and the first gate structure are coplanar, a first bottom surface of the SDB structure is even with a top surface of the STI, and a second bottom surface of the SDB structure is lower than the top surface of the STI; and
- performing a replacement metal gate (RMG) process to transform the first gate structure into a metal gate while the SDB structure completely fills the first trench.

* * * * *